United States Patent
Bauer et al.

(10) Patent No.: US 6,365,424 B1
(45) Date of Patent: Apr. 2, 2002

(54) SENSOR DEVICE AND METHOD OF PRODUCING A SENSOR DEVICE

(75) Inventors: Klaus Bauer, Regensburg; Josef Brem, Stetten; Ronald Henzinger, Regensburg; Markus Molin, Mintraching; Jörg Schindler, Neutraubling, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/642,848

(22) Filed: Aug. 17, 2000

(30) Foreign Application Priority Data

Aug. 17, 1999 (DE) .......................... 199 38 868

(51) Int. Cl.7 .................. H01L 21/66; H01L 21/00; H01L 21/44; H01L 23/04; G01R 31/26
(52) U.S. Cl. ................. 438/15; 438/6; 438/55; 438/125; 438/127; 257/690; 257/730; 257/790
(58) Field of Search ................. 438/14, 15, 5, 438/6, 54, 55, 124, 127, 126, 112; 73/1.38, 1.75–1.78, 1.51, 862.632, 514.01; 257/790, 730, 687, 690

(56) References Cited

U.S. PATENT DOCUMENTS 5,665,653 A * 9/1997 Bare et al. .................... 438/49
6,238,951 B1 * 5/2001 Caillat .......................... 438/108

FOREIGN PATENT DOCUMENTS

| DE | 34 46 248 A1 | 6/1986 |
| DE | 38 27 937 A1 | 2/1990 |
| DE | 40 36 994 A1 | 5/1992 |
| DE | 44 10 705 A1 | 10/1995 |
| DE | 44 47 513 A1 | 2/1996 |
| DE | 195 27 702 A1 | 1/1997 |
| DE | 39 17 979 C2 | 5/1998 |
| DE | 197 42 470 A1 | 4/1999 |
| EP | 0 548 470 B1 | 6/1995 |
| EP | 0 908 703 A1 | 4/1999 |

* cited by examiner

Primary Examiner—John F. Niebling
Assistant Examiner—Viktor Simkovic
(74) Attorney, Agent, or Firm—Herbert L. Lerner; Laurence A. Greenberg; Werner H. Stemer

(57) ABSTRACT

One or more contact elements for transmitting calibration data during the calibration of a sensor of the sensor device are electrically connected to a signal processing unit of the sensor. The contact element has a contact region in a groove of a housing part of the sensor device. A sealing compound, which seals the contact region, is introduced into the groove and a cover is brought into contact with the sealing compound in the groove. The groove, the sealing compound, and the cover are configured and they interact in such a way that the chamber communicates only with a working medium which is to be sensed by the sensor.

6 Claims, 4 Drawing Sheets

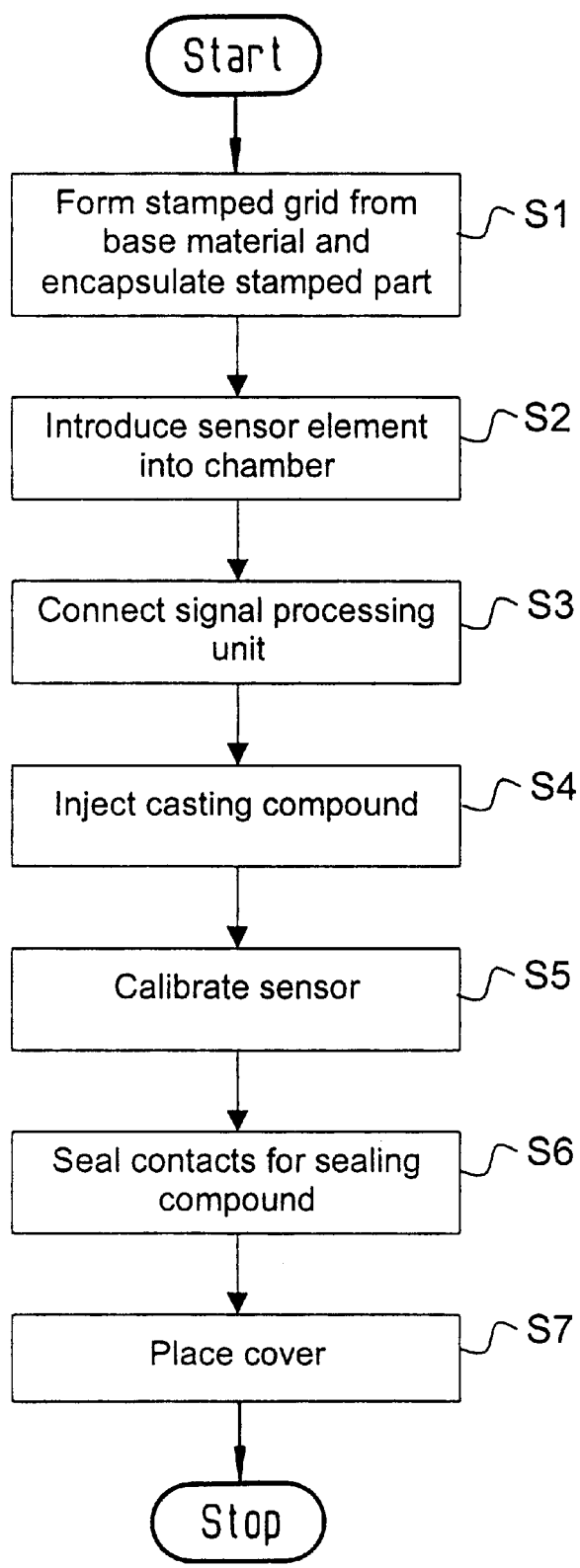

SENSOR DEVICE AND METHOD OF PRODUCING A SENSOR DEVICE

BACKGROUND OF THE INVENTION

Field of the Invention

The invention relates to a sensor device and a method of producing a sensor device with a sensor, which is embodied, in particular, as a pressure sensor.

European patent EP 0 548 470 B1 discloses a sensor device with a micromechanical pressure sensor. The pressure sensor is protected by a corrosion-resistant covering made up of a plurality of layers. A silicone gel serves as the first layer of the covering and as a pressure medium. The micromechanical pressure sensor is fitted in a housing.

It has been known, in the context of micromechanical semiconductor sensors, to form the sensor element and a signal processing unit integrally in the semiconductor sensor. In the signal processing unit, the measuring signal of the sensor element is converted by means of a characteristic curve and, if appropriate, by correction with correction values, into an output signal. The output signal is then fed to, say, an engine control system. If the sensor device is arranged in a manifold of an intake tract of an internal combustion engine, the sensor device senses the intake-pipe pressure. That information is needed by the engine control system for calculating the amount of fuel injected.

On account of the fabrication variations in the production of the sensors, the reference between the respective measured variable, for example a pressure, and the respective measuring signal of the sensor varies from sensor to sensor. Therefore, the sensors must be calibrated in order to establish a unique assignment between the measured variable and the respective output signal of the sensor.

It is known in the art to encapsulate the sensors with a casting compound. This protects them against the working media which, in some cases, are chemically aggressive. An exact calibration of the sensor is only possible after the encapsulation of the sensor with the casting compound, since the reference between the measured variable and the measuring signal of the sensor may be altered by the casting compound. If, however, the sensor is integrally formed by the sensor element and the signal processing unit, the signal processing unit can no longer be electrically contacted in order to carry out a calibration after the encapsulation of the sensor.

SUMMARY OF THE INVENTION

The object of the invention is to provide a sensor device and a method of producing the sensor device which overcomes the above-noted deficiencies and disadvantages of the prior art devices and methods of this kind, and which allows the sensor device to be exactly calibrated.

With the above and other objects in view there is provided, in accordance with the invention, a method of producing a sensor device, which comprises:

providing a housing part formed with a chamber and a groove;

placing a sensor having a sensor element and a signal processing unit in the chamber;

electrically connecting at least one contact element to the signal processing unit, the contact element having a contact region formed in the groove;

encapsulating the sensor element with a casting compound and subsequently electrically contacting the contact region in the groove of the housing part;

calibrating the sensor by aligning a characteristic curve of the sensor element with a predetermined characteristic curve and transmitting calibration data via the at least one contact element to the signal processing unit and storing the calibration data in the signal processing unit;

introducing sealing compound into the groove and sealing the contact region; and bringing a cover into contact with the sealing compound in the groove, and sealing the groove, the sealing compound and the cover together such that the chamber communicates only with a working medium.

In other words, the invention is distinguished in that the contact region of the contact elements can be electrically contacted well for calibrating and can be insulated well after calibration by introducing the sealing compound. Consequently, effective protection against influencing of the signal processing by interference signals and protection against corrosion are ensured. The invention makes simple and low-cost production of the sensor device possible.

In accordance with an added feature of the invention, the calibration data include at least one correction value.

In accordance with an additional feature of the invention, the calibration data comprise a calibrated characteristic curve of the sensor element.

With the above and other objects in view there is also provided, in accordance with the invention, a sensor device, comprising:

a housing part formed with a chamber and a groove;

a sensor having a sensor element and a signal processing unit;

fitted in the chamber and encapsulated with a casting compound;

a contact element for transmitting calibration data during a calibration of the sensor electrically connected to the signal processing unit, the contact element having a contact region formed in the groove of the housing part;

an amount of sealing compound introduced in the groove and sealing the contact region; and a cover in contact with the sealing compound in the groove, whereby the groove, the sealing compound, and the cover interact in such a way that the chamber communicates only with a working medium.

In accordance with another feature of the invention, the sealing compound is an adhesive sealing compound and the cover is adhesively fixed in the groove.

In accordance with a concomitant feature of the invention, the housing part is formed with a further groove, supporting feet of an electrical component are fitted in the further groove, and the adhesive sealing compound has been introduced into the further groove.

Other features which are considered as characteristic for the invention are set forth in the appended claims.

Although the invention is illustrated and described herein as embodied in a sensor device and method of producing a sensor device it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a flow diagram relating to the production of the sensor device.

Structurally identical and functionally equivalent elements are identified with the same reference numerals throughout the figures.

DESCRIPTION OF THE PREFERRED EMBODIMENTS

Figure 1:
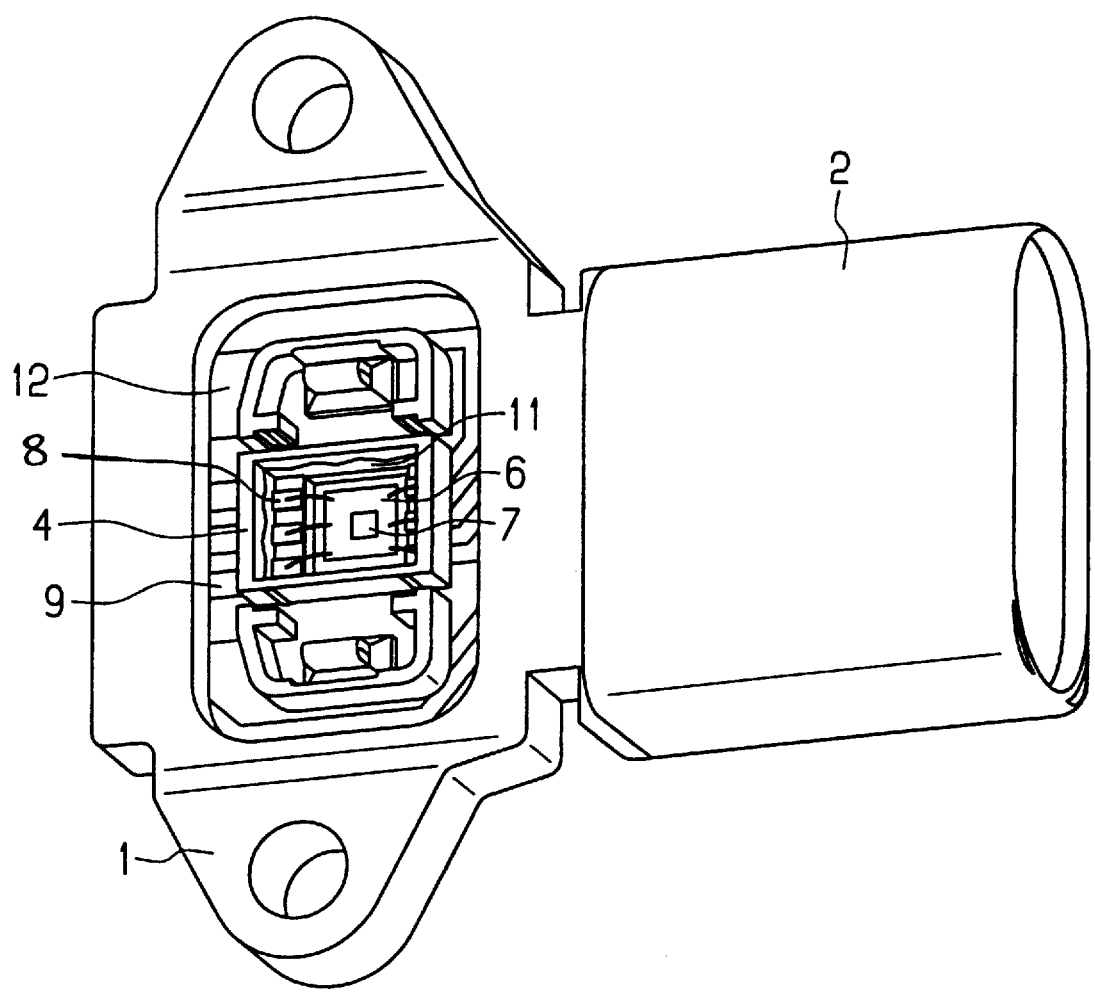
FIG. 1 is a perspective view of a sensor device.
Figure 2:
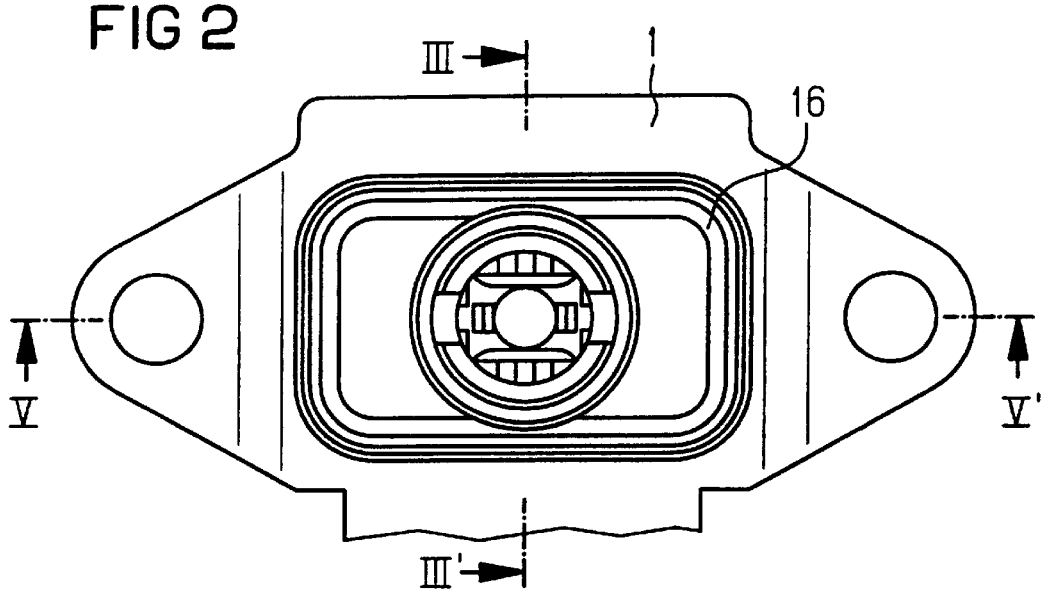
FIG. 2 is partial plan view of the sensor device.

Referring now to the figures of the drawing in detail and first, particularly, to FIG. 1 thereof, there is seen a sensor device with a housing part 1, which is integrally formed with a plug part 2. A chamber 4 is formed in the housing part 1 and a sensor is arranged in the chamber 4. The sensor comprises a sensor element 7 and a signal processing unit 6. The sensor is preferably implemented as a micromechanical semiconductor sensor. In the preferred embodiment, the sensor is a pressure sensor.

The signal processing unit 6 comprises a circuit configuration for generating an output signal in dependence on a measuring signal of the sensor element 7. Furthermore, the signal processing unit 6 comprises a memory for storing a characteristic curve or a characteristic field in which values of the output signal are plotted in dependence on the measuring signal. The memory preferably also stores correction values for correcting the measuring signal or the output signal.

The signal processing unit may be designed, for example, as a user-specific ASIC. The signal processing unit is connected in an electrically conducting manner to contacts of the plug part, which on the one hand can be contacted to a power supply and on the other hand can be contacted for transmitting the output signal of the signal processing unit 6. At least one contact element 8 is provided (in FIG. 1 three contact elements), which are led through the chamber 4 to a groove 12. The contact element is connected in an electrically conducting manner to the signal processing unit 6, preferably via bonding wires 13. The groove 12 is formed in the housing part 1 and encloses the chamber 4. A casting compound 11, which is formed for example from silicone gel, has been applied to the sensor element 7 and the signal processing unit 6. The casting compound protects the sensor element 7 and the signal processing unit against a chemically aggressive working medium, to which the sensor device may be exposed. Furthermore, the casting compound 11 also protects against mechanical damage. The sensor element 7 and the signal processing unit 6 are in this case cast with the casting compound 11 in such a way that at least one contact element 8 in the region of the chamber 4 and the electrical contacting established by the bonding wires 13 to the signal processing unit are likewise encapsulated by the casting compound 11.

In the groove 12 there is formed at the contact element 8 a contact region 9, which is suitable for the contacting of needle adapters of a calibrating device.

The sensor device has, furthermore, a cover 16 (see FIGS. 2–5), which is fitted in the groove 12. The cover 16 is fitted in the groove 12 after the calibration of the sensor. Prior to this, a sealing compound 14 is introduced into the groove 12, insulating the contact region 9 and at the same time taking the form of a seal for the cover 16. It is consequently ensured that, after the introduction of the sealing compound 14, the contact region 9 can no longer be electrically contacted and at the same time is protected against corrosion. It can in this way be ensured that no interference signals, which could contribute to a falsification of the stored calibration data, are transmitted via the contact element 8 during the operation of the sensor device.

The sealing compound 12 at the same time contributes to the connecting of the housing part 1 and the cover 16 to one another with a sealing effect. The cover 16 is preferably configured as a connecting piece with an opening to the working medium, which is for example the air in a manifold of an internal combustion engine.

It is ensured by the exemplary arrangement that the chamber 4 communicates only with the working medium. It is advantageous if the sealing compound 14 is in the form of an adhesive sealing compound and the cover 16 is adhesively fixed in the groove 12. This makes it possible to dispense with an otherwise additional mechanical fastening of the cover 16 on the housing part 1. The working medium is the medium in which the respective measured variable is to be sensed. In the case of a sensor device designed as an intake-pipe pressure sensor, this is the air in the manifold of the intake tract of the internal combustion engine.

Figure 5:
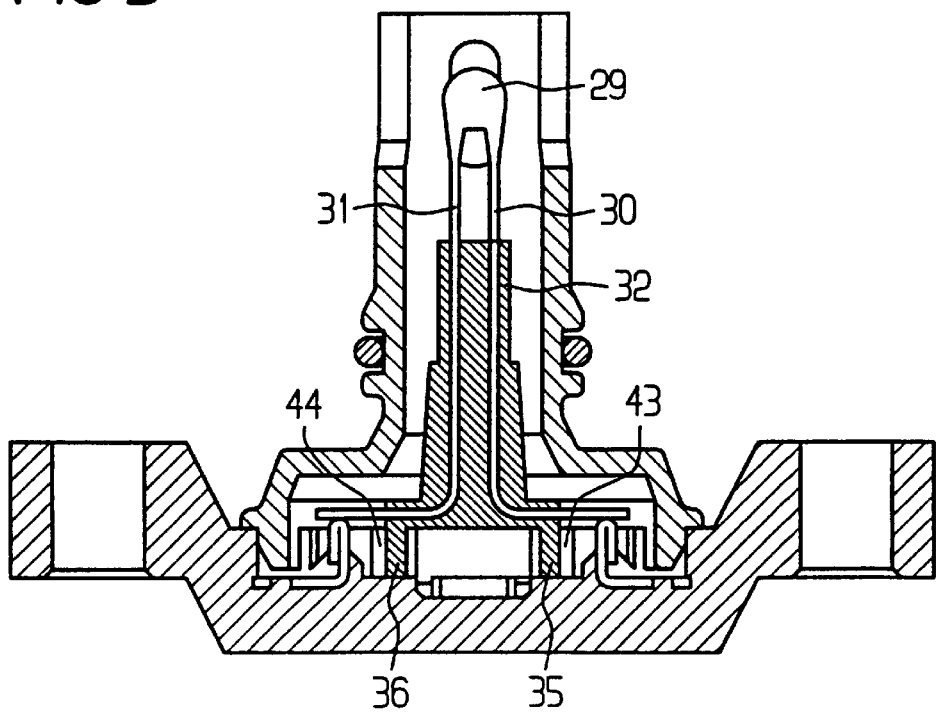
FIG. 5 is a sectional view through the sensor device taken along the line V–V' in FIG. 2.
Figure 4:
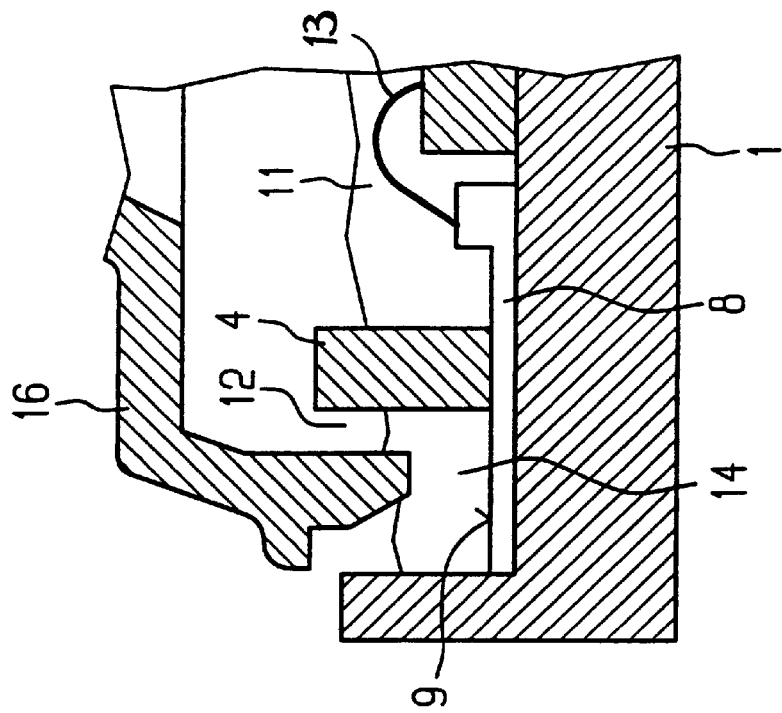
FIG. 4 is an enlarged detail of FIG. 3.
Figure 3:
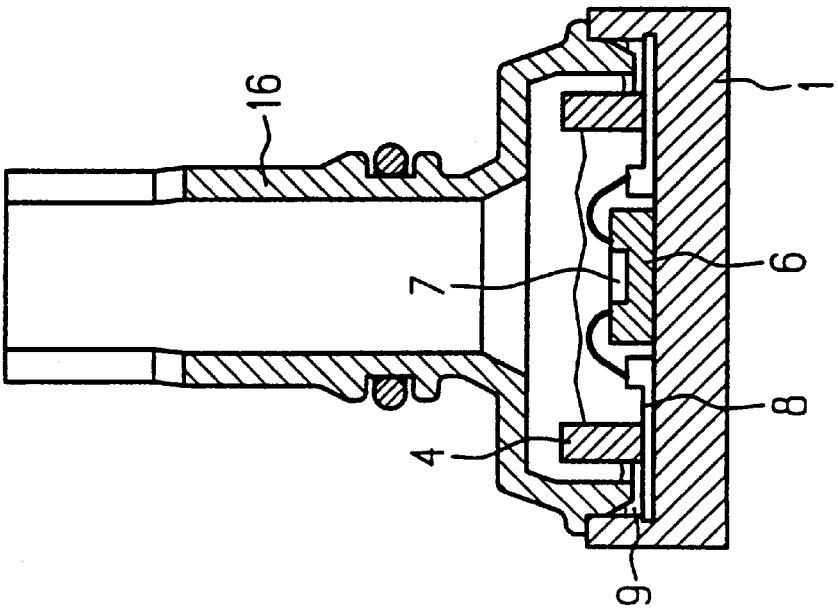
FIG. 3 is a sectional view through the sensor device taken along the line III–III' in FIG. 2.

Referring now to FIG. 5, in a more sophisticated embodiment of the invention, the sensor device is provided with an electrical component which is configured as a temperature sensor. The temperature sensor has a temperature sensor element 29, which has connection elements 30, 31, which are routed freely in one region and are subsequently routed in a supporting element 32. The supporting element 32 has supporting feet 35, 36, which are fitted in a further groove 43, 44. Formed in the further groove 43, 44 are preferably deformable plastic lugs, which serve for the mechanical fixing of the supporting feet 35, 36 in the further groove 43, 44. The further groove 43, 44 is preferably connected to the groove 12, so that the sealing compound 14 likewise penetrates into the further groove 43, 44. If the sealing compound is preferably in the form of an adhesive sealing compound, consequently simple mechanical fixing of the supporting element is ensured.

Referring now to FIG. 6, the sensor device may be produced in accordance with the flow diagram: In a step S1, a plate, which is formed from a base material, preferably a copper alloy, and a supplementary material, preferably aluminum, in plate form, is made into a stamped grid by stamping. The stamped grid comprises electrically conducting conductor tracks and the at least one contact element 8. The stamped grid is subsequently encapsulated with plastic in such a way that the housing part 1, the plug part 2, the chamber 4 and the groove 12 are formed.

In a step S2, the sensor, that is the sensor element 7 and the signal processing unit 6, is introduced into the chamber 4 and fastened on the first housing part 1, preferably by adhesion.

In a step S3, the signal processing unit 6 is connected in an electrically conducting manner to the contact element 8 and, if appropriate, further connections by bonding.

In a step S4, the casting compound 11 is introduced into the chamber, to be precise in such a way that it covers the sensor, bonding wires and the at least one contact element 8.

In a step S5, the calibration of the sensor takes place. Provided for this purpose is a calibrating device (not shown), which contacts the contact region 9 of the contact element 8 in an electrically conducting manner by at least one needle adapter. It preferably also contacts a plug-in contact, which is formed in the plug part 2 and via which the output signal of the sensor is transmitted.

Digital input/output ports of the signal processing unit 6 can preferably be contacted via the at least one contact element. The ports are, for example, designed as an "enable", "clock" or serial port. These ports are merely required for the calibration of the sensor.

To calibrate the sensor, the sensor device is preferably subjected to a predetermined pressure and/or temperature profile and corresponding measurement data, such as for example the output signal of the sensor device and/or the measuring signal of the sensor element 7, are sensed by the calibrating device. The calibrating device then calculates a characteristic curve in a manner dependent on the measurement data, to be precise in such a way that a predetermined relationship exists between the measured variable, which is preferably the pressure, and the output signal of the signal processing unit 6.

Correction values, which are for example dependent on the respective temperature, are preferably also calculated. Subsequently, the characteristic curve and/or the correction values are transmitted to the signal processing unit 6 and stored in a memory provided there. The signal processing unit 6 then calculates during the operation of the sensor device output signals in a manner dependent on the stored characteristic curve and, if appropriate, the correction value or values.

After the calibration in step S5 and after the calibrating device has been removed, the sealing compound 14 is introduced into the groove 12 and seals the contact region. Subsequently, in a step S7, the cover 16 is inserted into the groove and either fastened on the housing part 1 by means of a fastening element or preferably fastened by the sealing compound 14 in the form of an adhesive sealing compound.

The invention is not restricted to the exemplary embodiment described here. A two-stage depression is preferably created for example in the first housing part 1, in the chamber 4. In this case, a lower bead is designed such that the sensor, including the casting compound 11, does not come to lie above the contacting area for the bonding wires in the region of the contact element. A further bead is provided at a high level, permitting the hermetic casting of the sensor, including the bonding wires. Furthermore, by choosing a special material and creating a certain surface finish, the housing part 1 is preferably formed such that an area which can be inscribed by laser and read by machine is created. Furthermore, capacitors are preferably fastened on the stamped grid (leadframe) perpendicularly next to one another or one behind the other and are subsequently pre-encapsulated with a thin layer of plastic. The entire arrangement is subsequently molded into the housing part 1.

In order to make a wide variety of designs of the housing part 1 feasible with simple production technology, housing receptacles for receiving a work-holding fixture are designed such that their position in relation to both housing center axes is the same for all housing variants. The housing recesses may be closed or open, round or angular.

We claim:

1. A method of producing a sensor device, which comprises:

providing a housing part formed with a chamber and a groove;

placing a sensor having a sensor element and a signal processing unit in the chamber;

electrically connecting at least one contact element to the signal processing unit, the contact element having a contact region formed in the groove;

encapsulating the at least one contact element with a casting compound and subsequently electrically contacting the contact region in the groove of the housing part;

calibrating the sensor by aligning a characteristic curve of the sensor element with a predetermined characteristic curve and transmitting calibration data via the sensor element to the signal processing unit and storing the calibration data in the signal processing unit;

introducing sealing compound into the groove and sealing the contact region; and bringing a cover into contact with the sealing compound in the groove, and sealing the groove, the sealing compound and the cover together such that the chamber communicates only with a working medium.

2. The method according to claim 1, which comprises transmitting calibration data with at least one correction value.

3. The method according to claim 1, which comprises transmitting calibration data with a calibrated characteristic curve of the sensor element.

4. A sensor device, comprising:

a housing part formed with a chamber and a groove;

a sensor having a sensor element and a signal processing unit;

fitted in said chamber and encapsulated with a casting compound;

a contact element for transmitting calibration data during a calibration of said sensor electrically connected to said signal processing unit, said contact element having a contact region formed in said groove of said housing part;

an amount of sealing compound introduced in said groove and sealing said contact region; and a cover in contact with said sealing compound in said groove, whereby said groove, said sealing compound, and said cover interact in such a way that said chamber communicates only with a working medium.

5. The sensor device according to claim 4, wherein said sealing compound is an adhesive sealing compound and said cover is adhesively fixed in said groove.

6. The sensor device according to claim 5, wherein said housing part is formed with a further groove, supporting feet of an electrical component are fitted in said further groove, and said adhesive sealing compound has been introduced into said further groove.

* * * * *